United States Patent [19]

Zelm

[11] Patent Number: 5,172,289

[45] Date of Patent: Dec. 15, 1992

[54] AUTOMATIC INSULATION TESTER FOR GROUNDED AND UNGROUNDED ELECTRICAL EQUIPMENT

[76] Inventor: Richard J. Zelm, P.O. Box 184, Marrero, La. 70073

[21] Appl. No.: 842,037

[22] Filed: Feb. 26, 1992

Related U.S. Application Data

[60] Division of Ser. No. 608,352, Nov. 2, 1990, which is a continuation-in-part of Ser. No. 942,831, Dec. 17, 1986, abandoned.

[51] Int. Cl.⁵ .............................................. H02H 3/16
[52] U.S. Cl. ..................................... 361/23; 361/42; 324/523; 340/648
[58] Field of Search ...................... 361/28, 29, 31, 33, 361/42, 23; 318/771; 324/527, 523, 510, 544, 551; 340/650, 648

[56] References Cited

U.S. PATENT DOCUMENTS 4,367,506  5/1983  Lapsker .................. 361/31

Primary Examiner—Todd E. DeBoer
Attorney, Agent, or Firm—Pravel, Gambrell, Hewitt, Kimball & Krieger

[57] ABSTRACT

An automatic insulation tester tests the insulation resistance of electrical equipment when the electrical equipment is inoperative. The automatic insulation tester is automatically rendered operative when the electrical equipment is inoperative, and is automatically rendered inoperative when the electrical equipment is operative. The automatic insulation tester applies a voltage on the order of the rated voltage of the electrical equipment to the electrical equipment and measures and displays the insulation resistance of the electrical equipment. When the insulation resistance falls below a predetermined value, an indicator is activated, and remains in an activated state until the insulation resistance of the electrical equipment rises above the predetermined value and the automatic insulation tester is manually reset. In preferred embodiments of the present invention, the automatic insulation tester is provided with a ground interrupter to allow the automatic insulation tester to be used with permanently grounded electrical equipment. A single comparator can be used to monitor several motors or generators by multiplexing the inputs to the comparator and demultiplexing the output from the comparator. The selection means for the motor or generator can be automatic, so that a periodic cycling is performed, or can be manual.

2 Claims, 14 Drawing Sheets

AUTOMATIC INSULATION TESTER FOR GROUNDED AND UNGROUNDED ELECTRICAL EQUIPMENT

CROSS REFERENCE TO RELATED APPLICATIONS:

This is a divisional of application Ser. No. 608,352, filed Nov. 2, 1990, which is a continuation-in-part of co-pending U.S. Patent Application Ser. No. 06/942,831, filed Dec. 17, 1986, now abandoned, which is incorporated herein by reference.

BACKGROUND OF THE INVENTION:

1. Field of the Invention

This invention relates generally to insulation testers, and more specifically to insulation testers for electrical equipment.

2. General Background

Motors and generators are used in many industries and institutions. Offshore drilling rigs typically have one or more generators to meet their power requirements, as well as motors to perform various tasks on the rigs. Hospitals typically have backup generators for use in the event of a power outage.

A common cause of malfunctioning of electrical and electronic equipment is inadequate electrical insulation of the wiring, which can be due, for example, to manufacturing defects of the wiring, shorts introduced during manufacture of the equipment, or breakdown of the insulation.

There exist reliable methods of and devices for testing the soundness of electrical insulation of insulated wires prior to use in wiring systems and electrical and electronic equipment, both during and immediately after manufacture of the insulated wires. Examples of such devices and methods are disclosed in U.S. Pat. Nos. 3,413,541; 3,546,581; 3,789,294; 3,789,295; 3,823,370; 4,313,085; and 4,160,947.

There are also numerous means for testing electrical equipment to detect any problems with electrical insulation that may have been introduced during manufacture of the equipment. U.S. Pat. No. 4,152,640 discloses a method of testing the integrity of insulation of windings in newly manufactured electrical equipment by applying a positive DC voltage to both ends of one winding, a negative DC voltage of the same magnitude to both ends of another winding, grounding all other windings, and measuring the current flowing in series in the two windings being tested. The process is repeated until each winding has been tested with a positive and a negative voltage. A similar method is disclosed in which AC voltages, which are of the same magnitude but out of phase, are applied to the two windings being tested.

Even if the characteristics of the electrical insulation of wiring passes muster during testing prior to incorporation into equipment, and during testing before the equipment is put into use, there is no guarantee that the insulation will hold up indefinitely. Typical safeguards against damage to equipment due to insulation breakdown which occurs when the equipment is operative include fuses and circuit breakers which limit the amount of current passing through the equipment. Some non-grounded AC equipment is provided with "ground detectors" which constantly and automatically check the quality of the insulation of wiring by monitoring leakage current between the wiring and ground while the equipment is running, but which are inoperative when the equipment is not in use. Other devices to check insulation when equipment is running include a device disclosed in U.S. Pat. No. 4,214,311 which constantly monitors insulation resistance values in non-grounded DC equipment while the equipment is in operation, and one disclosed in U.S. Pat. No. 4,394,615 which monitors insulation between wiring and the housing of equipment when the equipment is on.

All too often, the potential for failure of electrical equipment caused by inadequate insulation occurs when the equipment is idle, due to insulation breakdown. Some common causes of insulation breakdown, in addition to thermal aging, include the presence of moisture, oil, grease, chemical fumes, and airborne contaminants. If the equipment is not tested until it is running, the testing may be useless because, if the insulation breakdown is serious enough, the equipment may fail and even explode on starting.

It is common practice today to occasionally check the insulation of motors and generators when the equipment is not running. A common way to do this is to open the motor or generator, find an exposed wire and check the resistance of the motor or generator by applying a DC voltage to the wire, and measuring the current which flows to ground (the chassis of the motor or generator). In the case of a permanently grounded system, the ground wire must be disconnected before the DC voltage is applied to a winding or a wire. Whether checking a grounded or ungrounded system, this method of insulation monitoring is time consuming and, therefore, is not performed as often as it should be. The inevitable result is that insulation breakdown goes undetected, and is often not discovered until a motor or generator fails when it is started, at great expense to its owner. Various solutions have been proposed to do away with the need for manually checking the insulation characteristics of motors when not in use. For example, U.S. Pat. No. 3,611,036 discloses a ground detecting circuit for a motor wherein two terminals of the motor are connected to two input power lines through diodes in series with neon lamps and current-limiting resistors. A ground (electrical contact between the wiring or windings and the chassis) in the motor produces a current flow through one or both of the lamps. A photosensitive resistor, in response to light from the lamps, activates a relay control circuit to open the input line to the motor so that the motor cannot be turned on.

U.S. Pat. No. 3,656,136 discloses a sensing device which is connected to one of the winding terminals of the motor when the motor is not operative. A voltage is applied to the winding terminal of the motor, and the current flowing through the terminal is monitored. When it rises above a predetermined level, a control signal is generated, activating a relay which causes contacts between the winding terminals and the input power lines to open, thereby preventing the motor from being turned on.

U.S. Pat. No. 4,319,297 discloses a protective system for motors in which a sensing means is coupled to a motor winding to detect and signal when the winding resistance drops below a predetermined level. Means are provided to decouple the motor winding from the sensing means when the motor is turned on.

While the solutions proposed in these three last-mentioned patents may be useful for detecting when the resistance of the windings of motors reaches an unacceptable level, they do not test the insulation, and only provide an indication of whether the resistance is above or below a certain, predetermined value. Also, they cannot be used with grounded motors or generators.

SUMMARY OF THE INVENTION

The present invention provides an automatic insulation monitor/tester which constantly monitors the insulation resistance of the windings of electrical equipment, such as motors or generators, when the electrical equipment is not in use. The monitor/tester preferably includes a high voltage power supply which applies a high voltage, preferably greater than or equal to the rated voltage of the electrical equipment, to a winding of the electrical equipment, and a sensing means measures the leakage current to ground. The value of the resistance of the insulation is preferably visually displayed, allowing an operator to note when the insulation resistance is dangerously low. When the resistance drops below a predetermined value, the insulation tester produces a signal. The signal may trigger, for example, a visual alarm, an audio alarm, or a relay switch which prevents the motor or generator being monitored from being started.

In preferred embodiments of the present invention, the signal actuates a latching relay which changes the state of relay contacts to open a circuit in a motor starter to prevent the motor or generator from being started, disconnect input power from the sensing means, disconnect input power from the high voltage power supply, and provide a visual indication that the insulation resistance has dropped below the predetermined value. The use of a latching relay is advantageous in that the relay contacts remain in the changed state until a reset button is manually pushed to return the contacts to the pre-fault state. Thus, even if, when he presses the reset button returning the insulation tester to an active condition, the insulation tester indicates that the insulation resistance has returned to an acceptable level, the operator of the machinery can tell that it had dropped to below an unacceptable level, and there can be an investigation to determine the cause of the drop in order to prevent it from happening again. For example, the investigation may reveal water in the motor or generator, indicating that it had gotten wet, causing the insulation resistance to drop. Precautions can then be made to prevent it from getting wet in the future.

Means are preferably provided to automatically render the insulation tester inoperative when the electrical equipment is started, and to automatically render the insulation tester operative when the electrical equipment is inoperative.

The insulation tester preferably comprises a ground interrupter to allow it to be used with grounded electrical equipment. The ground interrupter comprises a contact, in an electrical connection between the chassis and the windings of the electrical equipment, which is open when the insulation tester is operative, and closed when the electrical equipment is operative.

In some embodiments disclosed herein, a single tester can be used to automatically test several motors or generators. The automatic insulation monitor for multiple motors/generators comprises power supply means, switching means for electrically connecting the first output terminal of the power supply means to a winding of a motor/generator selected for monitoring, means for electrically connecting the second output terminal of the power supply means to the chassis of each of the motors/generators, sensing means for determining insulation resistance of the motor/generator selected for monitoring by measuring current flowing between the first and second output terminals of the power supply means, indicating means for indicating the value of insulation resistance of the motor/generator selected for monitoring, and control means for automatically causing the automatic insulation monitor to refrain from monitoring a motor/generator when the motor/generator is operative. The control means preferably comprises means to cause the switching means to skip over operative motors/generators. The automatic insulation monitor for multiple motors/generators preferably normally automatically monitors all non-operative motors/generators connected thereto, sequentially monitoring each non-operative motor/generator for a predetermined time interval, but the switching means can preferably be manually manipulated such that the automatic insulation monitor monitors a desired non-operative motor/generator connected thereto at the will of an operator. To allow it to be used with grounded electrical equipment, the automatic insulation monitor for multiple motors/generators preferably comprises ground-interrupting means for automatically interrupting the electrical connection between the winding and the chassis, when the motor/generator is selected for monitoring, of a motor/generator normally having an electrical connection between the winding and the chassis. The automatic insulation monitor for multiple motors/generators may advantageously include any other features disclosed in other embodiments which are compatible therewith and enhance its operation.

It is an object of the present invention to provide an automatic insulation tester for electrical equipment.

It is also an object of the present invention to provide an automatic insulation tester which displays the value of the insulation resistance of the windings.

Another object of the present invention is to provide an automatic insulation tester which produces a signal when the value of the insulation resistance of the windings drops below a predetermined value.

It is a further object of the present invention to provide an automatic insulation tester which prevents electrical equipment from starting when the insulation resistance of the windings drops below a predetermined value.

It is a further object of the present invention to provide an automatic insulation tester which can be used with grounded electrical equipment.

It is a further object of the present invention to provide an automatic insulation tester/monitor which can be used with multiple motors/generators, whether normally grounded or ungrounded.

BRIEF DESCRIPTION OF THE DRAWINGS

For a further understanding of the nature and objects of the present invention, reference should be had to the following detailed description, taken in conjunction with the accompanying drawings, in which like parts are given like reference numerals, and wherein.

Figure 1:
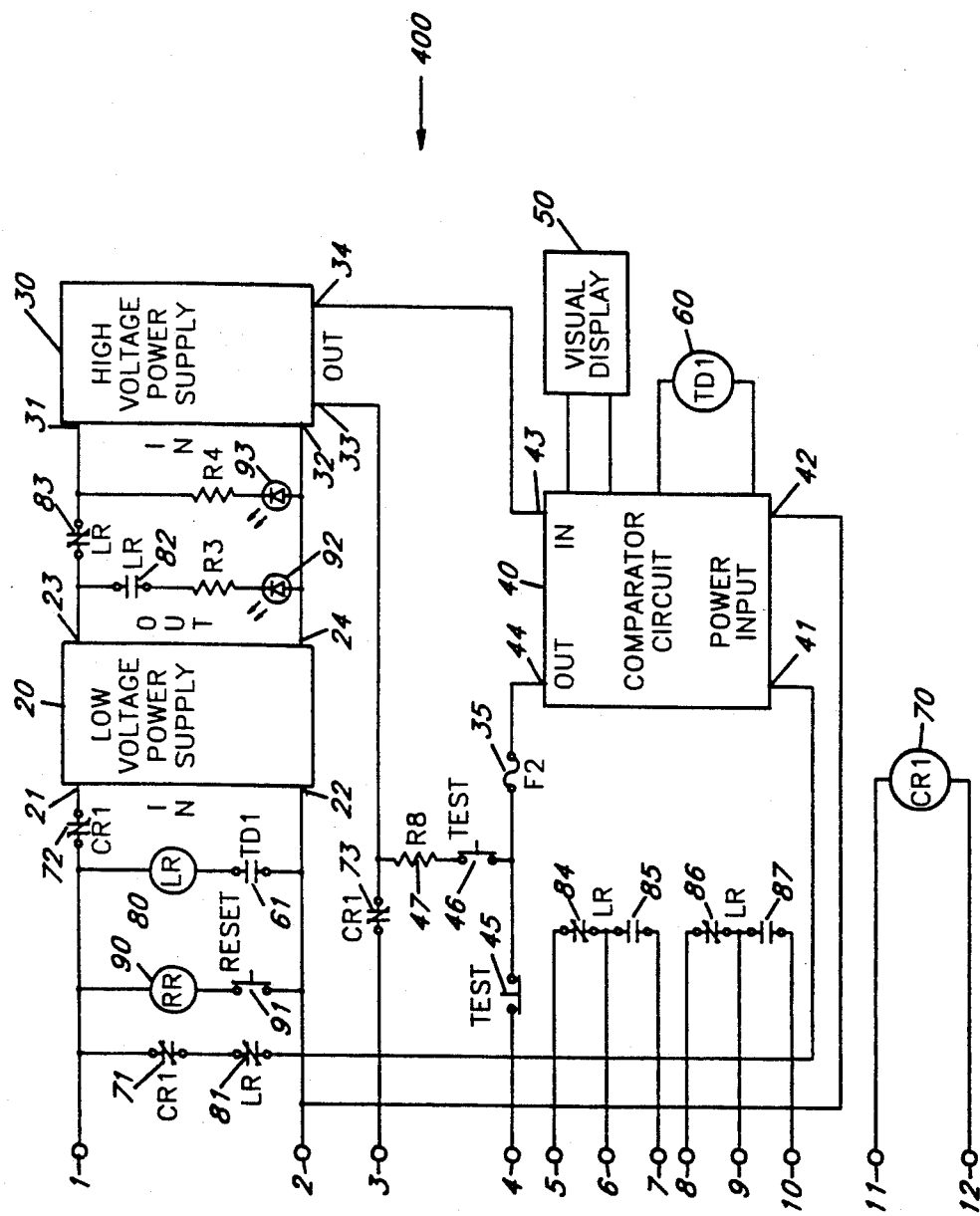
FIG. 1 is a schematic diagram of a first embodiment of the automatic insulation tester of the present invention.
Figure 2:
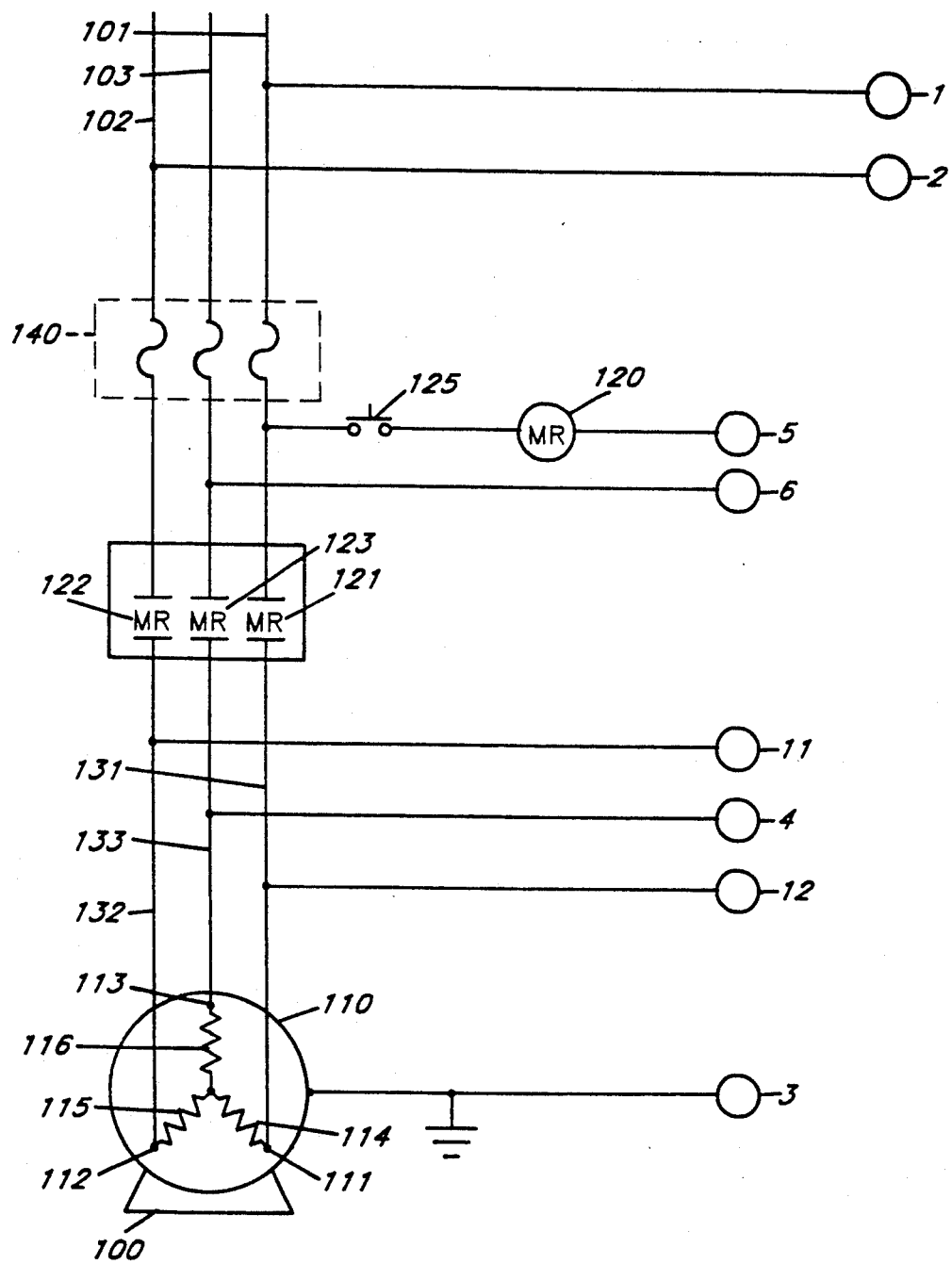
FIG. 2 is a schematic diagram showing a typical installation of the insulation tester shown in FIG. 1.

DETAILED DESCRIPTION OF THE PREFERRED EMBODIMENT:

Referring now to the drawings, the circuitry of the preferred embodiment of the insulation tester of the present invention is shown in FIG. 1, and may be permanently connected to electrical equipment as shown in FIG. 2.

The electrical equipment shown in FIG. 2 comprises a three phase motor 100 having a chassis 110 and windings 114, 115 and 116. Winding terminals 111, 112 and 113 are electrically connected through lines 131, 132 and 133 and a circuit breaker 140, to buss lines 101, 102 and 103, respectively. Normally-open motor relay contacts 121, 122 and 123 are present in lines 131, 132 and 133, respectively, and are controlled by motor relay coil 120, which itself is activated by a starter switch 125.

Automatic insulation tester 400 comprises a low voltage power supply 20, a high voltage power supply 30, a comparator circuit 40 and a visual display of resistance 50.

Input terminals 21 and 22 of low voltage power supply 20 are electrically connected to terminal connections 1 and 2, which are electrically connected to buss lines 101 and 102, respectively. Output terminals 23 and 24 are electrically connected to input terminals 31 and 32, respectively, of high voltage power supply 30. Output terminal 33 of high voltage power supply 30 is electrically connected to terminal connection 3, which is electrically connected to chassis 110 of motor 100. A fuse 35 is electrically connected in series between test input terminal 44 and terminal connection 4. Output terminal 34 is electrically connected to test input terminal 43 of comparator circuit 40, and test input terminal 44 is electrically connected to terminal connection 4, which is itself electrically connected to winding terminal 113 of motor 100.

Power input terminals 41 and 42 of comparator circuit 40 are electrically connected to terminal connections 1 and 2, respectively. Visual display of resistance 50 and a control relay coil 60 are each electrically connected across comparator circuit 40. A normally-closed test contact 45 is connected in series between test input terminal 44 and terminal connection 4. A normally-open test contact 46 and a resistor 47 are electrically connected in series between test input terminal 44 and output terminal 33.

A control relay coil 70 is electrically connected to terminal connections 11 and 12 which are electrically connected to lines 132 and 131, respectively, of motor 100. A latching relay coil 80 and a release relay coil 90 are each electrically connected across terminal connectors 1 and 2. A normally-open reset switch 91 is connected in series with release relay coil 90. Light emitting diodes (LEDs) 92 and 93 are each electrically connected across output terminals 23 and 24 of low voltage power supply 20. Resistors R3 and R4 are electrically connected in series with LEDs 92 and 93, respectively.

Normally-open contact 61 is controlled by time delay relay coil 60. Normally-closed contacts 71, 72 and 73 are controlled by control relay coil 70. Normally-open contacts 82, 85 and 87 and normally closed contacts 81, 83, 84 and 86 are controlled by latching relay coil 80 and release relay coil 90. Coil 80, when activated, serves to switch the state of contacts 81–87 from that shown in FIG. 1, and coil 90 serves to switch the state of contacts 81–87 back to that shown in FIG. 1. Contacts 81–87 are latching contacts—that is, a momentary impulse of current through latching relay coil 80 changes their state from that shown in FIG. 1, and contacts 81–87 stay in that state until a momentary impulse of current through release relay coil 90 changes their state back to that shown in FIG. 1. Contacts 61 and 71–73 are normal contacts, whose state remains changed only as long as current flows through the respective coil controlling them.

In operation, with motor 100 inoperative, automatic insulation tester 400 works in the following manner. Low voltage power supply 20 receives power at its input terminals 21 and 22 from buss lines 101 and 102, and produces a stable low voltage at its output terminals which powers LED 93 and high voltage power supply 30 through normally closed contacts 83 and 72. LED 93 indicates that insulation tester 400 is operational.

High voltage power supply 30 produces a stable high voltage on the order of, and preferably greater than or equal to, the rated voltage of motor 100, across its output terminals 33 and 34.

Comparator circuit 40 measures the resistance of the insulation of windings 114, 115 and 116 by measuring the current flowing from test input terminal 43 to test input terminal 44, which is equal to the current flowing from windings 114, 115 and 116 to chassis 110 of motor 100. This value of resistance is displayed in visual display 50 (also shown in FIG. 9). By viewing display 50, an operator can readily tell whether the resistance of the insulation is sufficiently high, or is getting dangerously low. He can take readings from display 50 periodically to note any trend showing gradual degradation of the insulation, and, take preventative measures to reinsulate the windings before motor 100 malfunctions due to low insulation resistance. Also, to insure that the reading displayed is accurate, he may press test switch 48 (FIG. 9) which opens test contact 45 and closes test contact 46, which applies the output of high voltage power supply 30 across test resistor 47. If high voltage power supply 30 is producing voltage of the proper value, needle 51 (FIG. 9) of display 50 will move to calibration set point 52. If not, the output of high voltage power supply 30 can be adjusted, as will be explained further in the description of FIG. 8.

Should the value of the insulation resistance drop below a predetermined value, time delay relay coil 60 energizes, changing the state of contact 61 from opened to closed. Current then flows through latching relay coil 80, changing the state of contacts 81–87 from that shown in FIG. 1.

Contact 81 opens, interrupting power to comparator circuit 40. Contact 82 closes, allowing current to flow through LED 92, illuminating LED 92, which indicates to an operator of the motor that the insulation resistance has dropped to below the predetermined value, and the insulation tester is in a fault condition.

Contact 83 opens, interrupting power to high voltage power supply 30 so that test voltage is no longer applied across the windings and the chassis of motor 100. The opening of contact 83 also interrupts power to LED 93, causing LED 93 to shut off.

Contact 84 opens, interrupting the starter circuit of motor 100, which prevents motor 100 from being started even if starter switch 125 is subsequently closed.

When power to comparator circuit 40 is interrupted, time delay relay coil 60 is de-energized, and contact 61 returns to the open state shown in FIG. 1. Due to the fact that contacts 81–87 are latching contacts, they remain in their changed state even though current no longer flows through latching relay coil 80. Thus, the insulation tester remains in a fault condition, even if the value of the insulation resistance rises above the predetermined value. The use of latching contacts 81–87 is advantageous in that the operator of the motor can observe that the insulation resistance of the windings has dropped below a predetermined value, even though it may have only been for a brief period of time when no one was observing automatic insulation tester 400.

When the operator tries to start motor 100, open contact 84 will prevent motor relay coil 120 from energizing, thus preventing motor 100 from starting even if the operator presses starter switch 125. The operator then presses reset button 94 (FIG. 9) momentarily closing reset switch 91, which energizes release relay coil 90, changing the state of contacts 81–87 back to that shown in FIG. 1. If the insulation resistance has not risen above the predetermined value, time delay relay coil 60 will energize again, closing contact 61, energizing latching relay coil 30, which again changes the state of contacts 81–87 from that shown in FIG. 1, again opening contact 84 in the starter circuit. Thus, the operator is prevented from starting motor 100 when the insulation resistance is below the predetermined value. If, however, the insulation resistance has risen above the predetermined value, time delay relay coil 60 does not energize, contacts 81–87 remain in the stage shown in FIG. 1, and the operator can start motor 100.

The operator starts motor 100 by closing starter switch 125, which causes current to flow through closed contact 84, energizing motor relay coil 120. Energization of motor relay coil 120 causes contacts 121, 122 and 123 to close, allowing current to flow from buss lines 101, 102 and 103 to winding terminals 111, 112 and 113 through lines 131, 132 and 133, respectively. Current is then allowed to flow from line 131 to line 132 via control relay coil 70, energizing coil 70. Energization of coil 70 causes contact 71–73 to open. Opening contact 71 opens the connection between power input terminal 41 and terminal connection 1, interrupting power to comparator circuit 40. Opening contact 72 interrupts power to low voltage power supply 20. Opening contact 73 opens the connection between output terminal 33 of high voltage power supply 30 and chassis 110 of motor 100, breaking the electrical connection between windings 114, 115, 116 and chassis 110. This prevents current from flowing through windings 114, 115 and 116 through high voltage power supply 30 to chassis 110. If the output impedance of high voltage power supply 30 is sufficiently high such that only negligible current would flow through its output terminals, contact 73 could be omitted. Contact 73, however, is preferably retained even if the output impedance of high voltage power supply 30 is high, to prevent current from flowing through high voltage power supply 30 in the event that a short circuit should develop therein. Fuse 35 is an additional safety feature, which can be used in addition to or instead of contact 73. Fuse 35 blows if the current flowing through it rises above a predetermined value, which value is greater than the current normally flowing from terminal connection 4 to output terminal 34, and less than the value of current which would flow through fuse 35 should a short develop in high voltage power supply 30 while motor 100 is operative.

When motor 100 is shut off by opening starter switch 125, motor relay coil 120 is de-energized, returning contacts 121, 122 and 123 to the open state shown in FIG. 2. Control relay coil 70 then de-energizes, returning contacts 71, 72 and 73 to the state shown in FIG. 1. Comparator circuit 40 and low voltage power supply 20 again receive power, output terminal 33 of high voltage power supply 30 is again connected to chassis 110 and automatic insulation tester 400 is in an operational condition. Insulation tester 400 remains in an operational condition until either a fault condition is detected by comparator circuit 40, or until motor 100 is started again.

Figure 3:
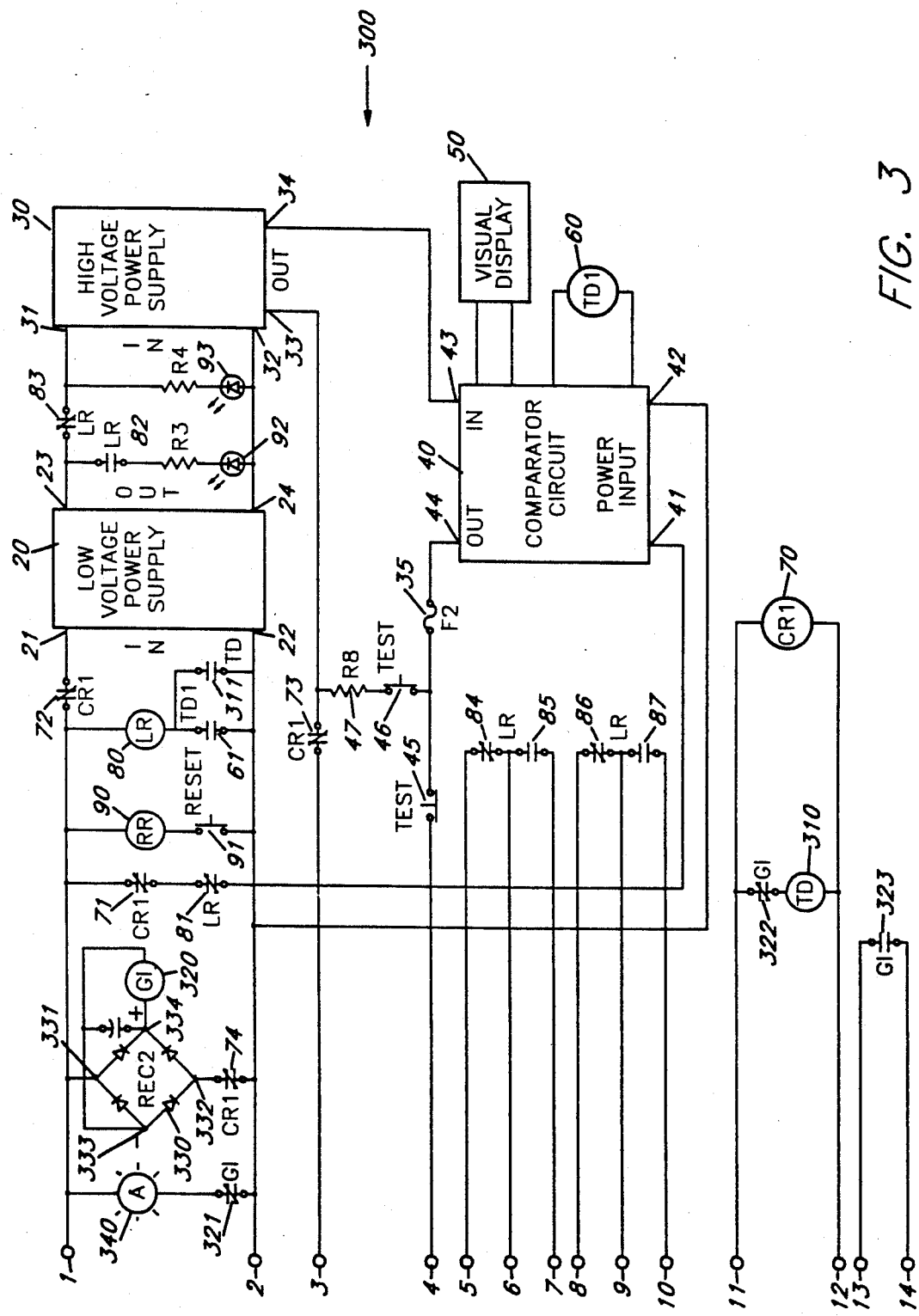
FIG. 3 shows an embodiment of the automatic insulation tester of the present invention which can be used with grounded electrical equipment.
Figure 4:
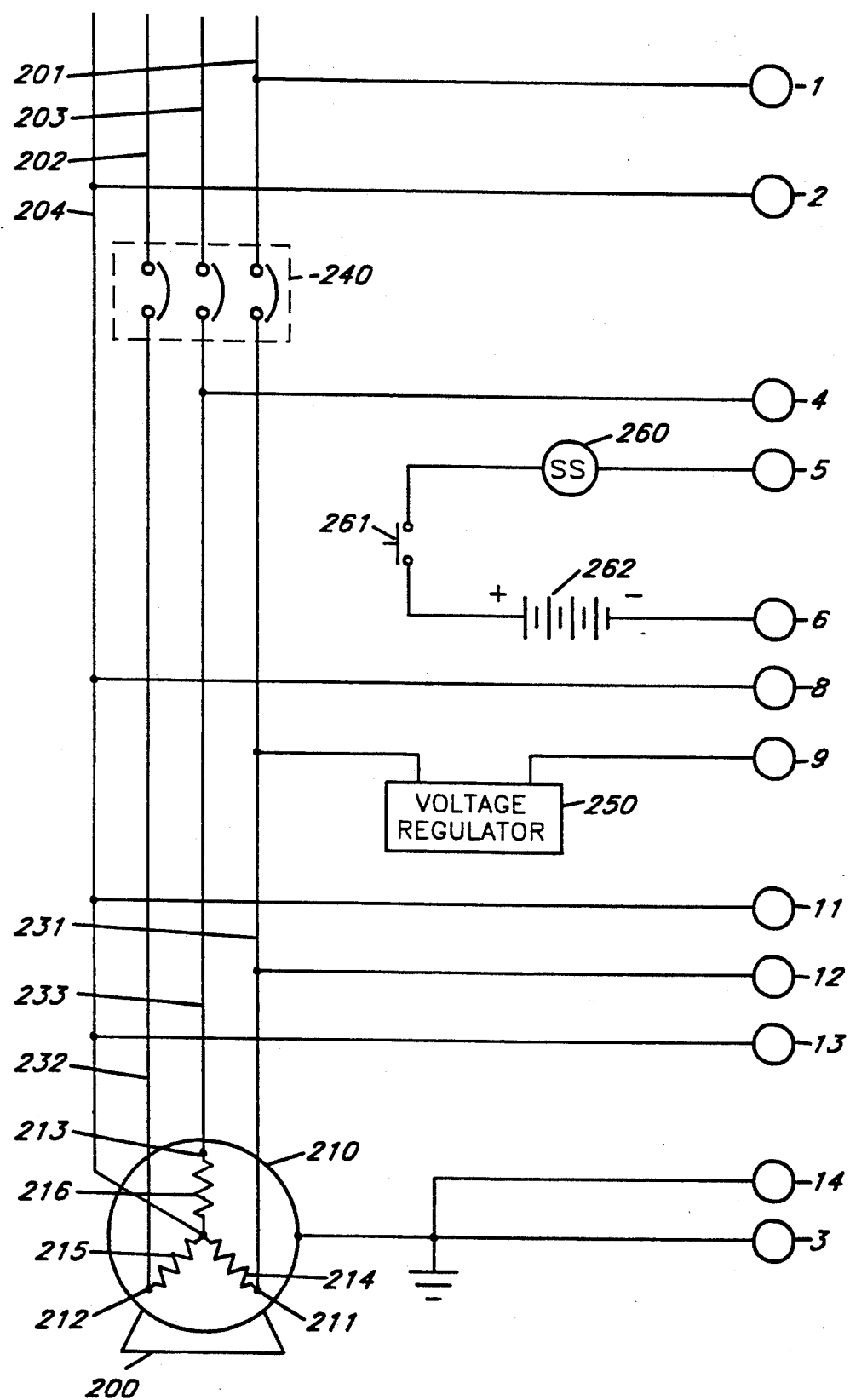
FIG. 4 shows a typical connection of the embodiment shown in FIG. 3 to grounded electrical equipment.

An embodiment of the present invention which may be used with grounded electrical equipment, such as that shown in FIG. 4, is shown in FIG. 3.

The electrical equipment shown in FIG. 4 comprises a three phase, four wire generator 200 having a chassis 210 and windings 214, 215 and 216. Winding terminals 211, 212 and 213 of windings 214, 215 and 216, respectively, are electrically connected, via lines 231, 232 and 233 and a circuit breaker 240 to "live" buss lines 201, 202 and 203, respectively. A neutral line 204 is electrically connected to the junction of windings 214, 215 and 216. Also shown in FIG. 4 are the voltage regulator 250 of generator 200, and the starter solenoid 260, start switch 261 and battery 262 of the engine (not shown) of generator 200.

The circuitry shown in FIG. 3 comprises the elements shown in FIG. 1, along with additional elements which enable it to be used with grounded electrical equipment such as that shown in FIG. 4. These additional elements include a DC ground interrupter relay coil 320 which is connected across the output terminals 333 and 334 of a rectifier bridge 330, input terminal 331 of rectifier bridge 330 being electrically connected to terminal connection 1. Normally-closed contact 74, controlled by control relay coil 70, is electrically connected between input terminal 332 of rectifier bridge 330 and terminal connection 2. If ground interrupter coil 320 is an AC coil, rectifier bridge 330 could be omitted. An open-ground indicating means 340, which may be, for example, an LED or other visual indicator, is electrically connected to terminal connection 1 and normally closed contact 321, controlled by ground interrupter coil 320. Contact 321 is also electrically connected to termina oconnection 2. A capacitor C15 is connected in parallel with ground interrupter relay coil 320.

Normally-open contact 311, controlled by time delay coil 310, is electrically connected between latching relay coil 80 and terminal connection 2, in parallel with contact 61.

Normally-open contact 323, controlled by ground interrupter relay coil 320, is electrically connected between terminal connections 13 and 14.

For purposes of illustration, all contacts shown in FIG. 3 are shown in the state in which they are when insulation tester 300 is installed as indicated in FIG. 4, with buss lines 201, 202 and 203 "live". Insulation tester 300, shown in FIG. 3, is installed as shown in FIG. 4, in the following manner. Buss line 201 and neutral line 204 are electrically connected to terminal connections 1 and 2, respectively. Winding 216 is electrically connected to terminal connection 4 via line 233. Starter solenoid 260 is electrically connected to terminal connection 5, and battery 262 is electrically connected to terminal connection 6. Neutral line 204 is electrically connected to terminal connection 8 and voltage regulator 250 is electrically connected to terminal connection 9. Terminal connections 11 and 12 are electrically connected to neutral line 204 and line 231, respectively. Terminal connections 13 and 14 are electrically connected to neutral line 204 and chassis 210, respectively. Terminal connection 3 is electrically connected to chassis 210.

In operation, insulation tester 300 works in the following manner. When generator 200 is inoperative, current flows through ground interrupter relay coil 320, via contact 74. Ground interrupter coil 320 remains energized as long as contact 74 remains closed, and energization of coil 320 causes contacts 321 and 322 to be closed and contact 323 to be opened, as shown in FIG. 3. Thus, when coil 320 in energized, the electrical connection between terminal connections 13 and 14 is open, interrupting the electrical connection between neutral line 204 and chassis 210, allowing insulation tester 300 to test the insulation resistance of windings 214, 215 and 216 of generator 200 in the same manner as insulation tester 400 tests the insulation resistance of windings 114, 115 and 116 of motor 100. Contact 321 allows current to flow through open-ground indicating means 340, signaling to an operator that neutral line 204 is disconnected from chassis 210 (that is, that generator 200 is not grounded).

Should the insulation resistance of windings 214, 215 and 216 drop below the predetermined value, after a predetermined time period time delay coil 60 energizes. Energization of coil 60 causes contact 61 to close, allowing latching relay coil 80 to energize and change the state of contacts 81-87 from that shown in FIG. 3. Contacts 81 and 83 open, interrupting power to comparator circuit 40, LED 93 and high voltage supply 30. Contact 82 closes, allowing LED 92 to illuminate, indicating that insulation tester 300 has detected a fault condition. Contact 84 opens, breaking the electrical contact between terminal connections 5 and 6, thereby preventing starter solenoid 260 from energizing even if switch 261 is closed. Contact 86 opens, breaking the electrical contact between terminal connections 8 and 9. Insulation tester 300 is reset in the same manner as insulation tester 400, by closing reset switch 91.

If no fault condition has been detected, or insulation tester 300 is reset and a fault condition no longer exists, the operator of the generator may start the generator. The operator of generator 200 starts generator 200 by closing start switch 261, which causes current to flow through starter solenoid 260, starting the engine (not shown) of generator 200. Current then flows from line 231 to neutral line 204 through control relay coil 70, energizing coil 70 and causing contacts 71-74 to change from the state shown in FIG. 3. Contact 71 opens, interrupting input power to comparator circuit 40. Contact 72 opens, interrupting power to low voltage power supply 20. Contact 73 opens, interrupting the electrical connection between output terminal 33 of high voltage power supply 30 and chassis 210 of generator 200. Contact 74 opens, interrupting power to ground interrupter coil 320, which causes the state of contacts 321, 322 and 323 to change from that shown in FIG. 3. Contact 323 closes, establishing electrical communication between neutral line 204 and chassis 210. Contact 321 opens, interrupting power to open-ground indicating means 340. Contact 322 opens, interrupting power to time delay coil 310.

If all contacts change state as they should, normal operation of generator 200 is unimpeded. When generator 200 is shut off, control relay coil 70 de-energizes, causing the state of contacts 71-74 to change back to that shown in FIG. 3. Contact 71 closes, allowing comparator circuit 40 to be powered. Contact 72 closes, allowing low voltage power supply 20 to be powered. Contact 73 closes, re-establishing electrical contact between output terminal 33 and chassis 210. Contact 74 closes, allowing ground interrupter coil 320 to energize. Energization of ground interrupter coil 320 causes the state of contacts 321, 322 and 323 to change back to that shown in FIG. 3. Contact 323 opens, disconnecting the electrical connection between neutral line 204 and chassis 210. Contact 322 closes, re-establishing electrical contact between time delay coil 310 and terminal connections 11 and 12. Contact 321 closes, causing open-ground indicating means 340 to be powered. A time delay coil is used as coil 60 in the event that contact 323 does not open before comparator circuit 40 is powered, and comparator circuit 40 detects resistance below the predetermined value between chassis 210 and windings 214, 215 and 216 via terminal connections 13 and 14. Time delay relay coil 60 cannot energize until the low resistance is detected for a predetermined time period. The time delay period of time delay coil 60 is set long enough to give contact 323 time to open before time delay relay coil 60 can energize. Otherwise, every time generator 200 would shut off, since contacts 71-74 close before ground interrupter coil 320 energizes and opens contact 323, a fault condition would be detected by comparator circuit 40, causing coil 60 to energize, closing contact 61, and causing insulation tester 300 to shift to a fault condition. (Although coil 60 is shown and described as a time delay relay coil in FIG. 1, it could instead be a normal relay coil, since the delay period is not essential in ungrounded systems).

Insulation tester 300 is again in an operational condition, in which it remains until either a fault condition is detected by comparator circuit 40, or until generator 200 is started again.

Should contact 74 fail to open when generator 200 is turned on, ground interrupter coil 320 will not de-energize and the state of contacts 321, 322 and 323 would not change from that shown in FIG. 3. In such a case, there would be no electrical connection between windings 214, 215, 216 and chassis 210 so generator 200 would run while ungrounded, which would be in violation of safety codes where grounded electrical equipment is required. To prevent generator 200 from running while ungrounded, contact 322, time delay coil 310 and contact 311 are provided in automatic insulation tester 300. Time delay coil 310 would, after a predetermined time period, energize, closing contact 311. Current then flows through latching relay coil 80, changing the state of contacts 81-87 that shown in FIG. 3. Contact 86 opens, causing voltage regulator 250 to stop operating, which prevents voltage from building up in generator 200 while the generator is ungrounded. Since contact 321 remains closed, open-ground indicating means 340 remains energized, and the operator knows that generator 200 is not operating properly because insulation tester 300 has detected that there is no electrical connection between neutral line 204 and chassis 210. He would then contact a serviceman to correct the problem. The time delay period of time delay coil 310 is set long enough to, under normal conditions, give contact 74 time to open, allowing ground interrupter coil 320 to deenergize and open contact 322 before time delay coil 310 energizes. Otherwise, time delay coil 310 would energize every time generator 200 is started, causing latching relay coil to energize and preventing generator 200 from operating properly. Instead of voltage regulator 250, an air damper control circuit, for example, could be connected to terminal connections 8 and 9 such that the engine (not shown) of generator 200 would shut off when contact 74 fails to open.

When buss lines 201, 202 and 203 are not always "live" and no source of AC is constantly available, a battery would be used to power the automatic insulation tester. In such a case, insulation tester 300 shown in FIG. 3 would not be practical, as a great deal of current is necessary to energize ground interrupter coil 320, and a battery would quickly discharge if it were used to energize ground interrupter coil 320. In such a case, the preferred embodiment of the present invention—insulation tester 500, shown in FIG. 5, would be used. The only difference between insulation tester 300 and insulation tester 500 is that in insulation tester 500, ground interrupter coil 320 and rectifier bridge 330 are connected across terminal connections 11 and 12 instead of across terminal connections 1 and 2, and contact 74 is eliminated.

Figure 6:
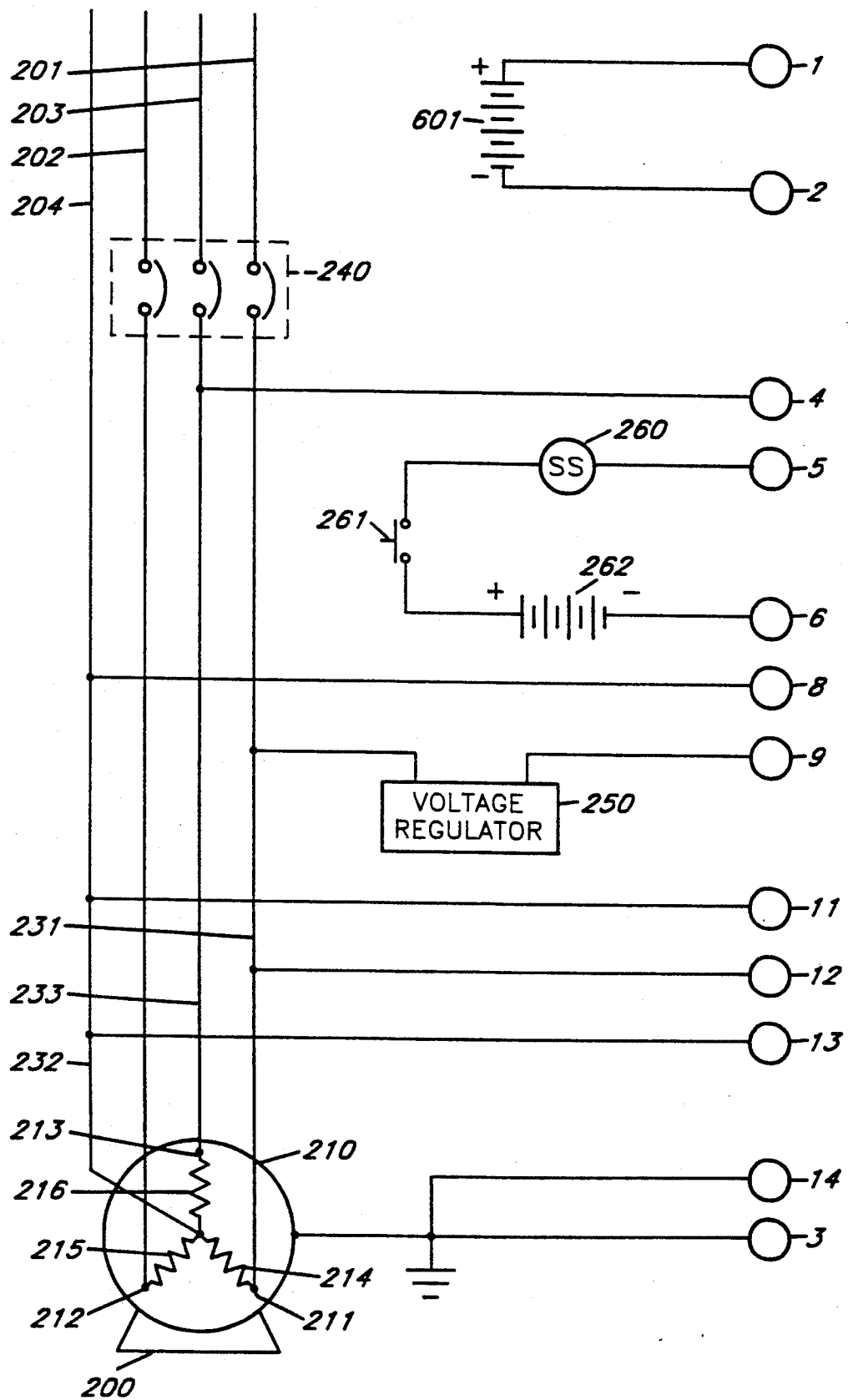
FIG. 6 shows a typical connection between the embodiment of the invention shown in FIG. 5 and grounded electrical equipment.

FIG. 6 shows insulation tester 500 installed in the same manner as insulation tester 300 is installed in FIG. 4, the only difference being that terminal connections 1 and 2 are connected to a battery 601 instead of to buss line 201 and neutral line 204. As in insulation tester 300, contacts 321 and 322 remain closed and contact 323 remains open when generator 200 is inoperative, but in insulation tester 500, this is due to ground interrupter coil 320 being unenergized, rather than energized as in tester 300, when generator 200 is inoperative. Other than the operation of ground interrupter coil 320, insulation tester 500 works in the same manner as insulation tester 300. It should be noted that, when buss lines 201, 202, and 203 are always "live", automatic insulation tester 500 can be installed as shown in FIG. 4.

Figure 7:
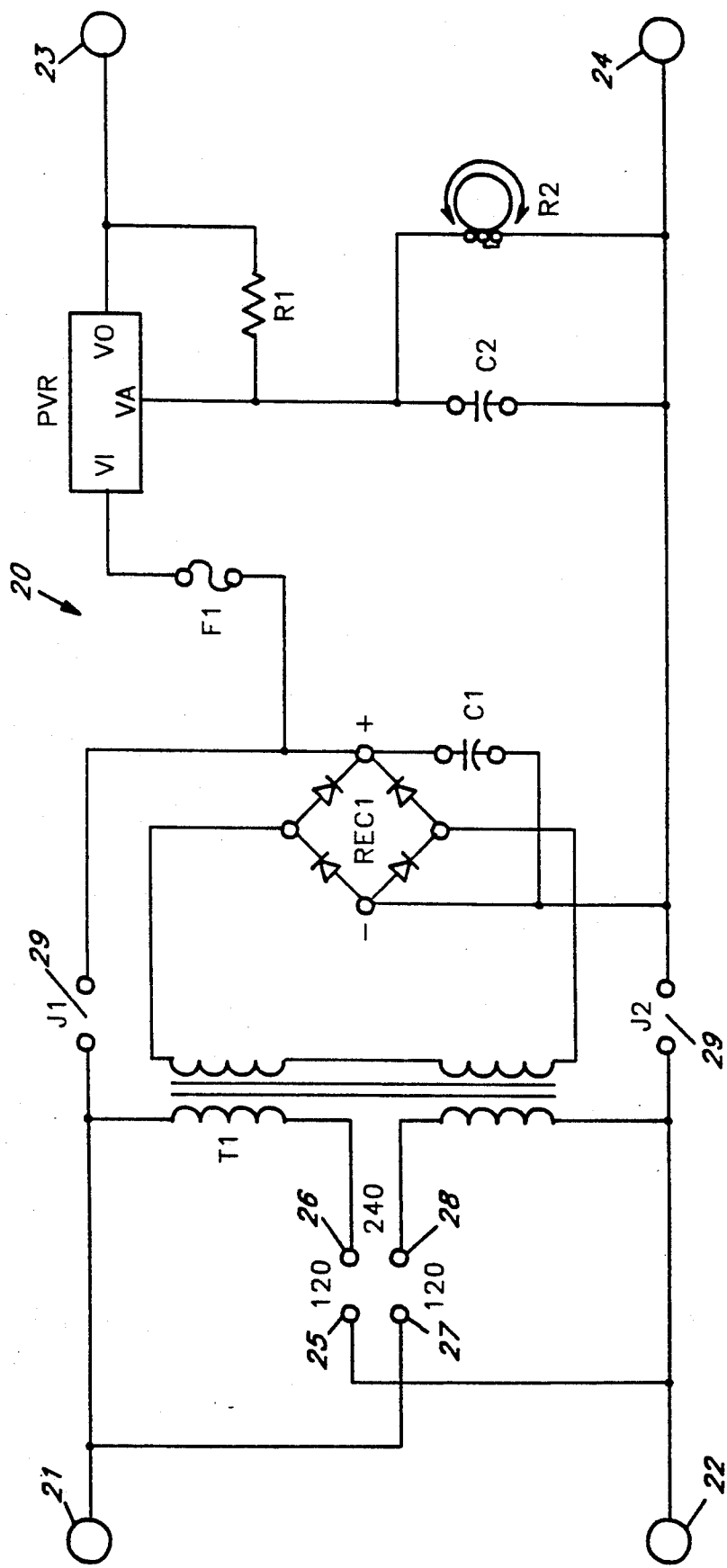
FIG. 7 is a schematic diagram of a low voltage power supply in accordance with the present invention.

Referring now to FIG. 7, an example of a multi-input low voltage power supply, which can be used in the insulation tester of the present invention, is shown. When using 110 VAC as the source of power connected to input terminals 21 and 22, terminal 25 is connected to terminal 26, and terminal 27 is connected to terminal 28. When using 240 VAC connected to input terminals 21 and 22, terminal 26 is connected to terminal 28. When using a battery connected to input terminals 21 and 22, contacts 29 are closed, allowing the DC current to bypass the transformer T1. Regardless of whether the input voltage is 12 VDC, 24 VDC, 110 VAC or 240 VAC, a stable 6 VDC is produced by low voltage power supply 20 across its output terminals 23 and 24. The above-mentioned voltages are exemplary only, and represent some of the more commonly available supply voltages in the United States. Other voltages, if desired, could of course be used. In addition to the components previously mentioned, also shown in FIG. 7 are a rectifier bridge REC1, capacitors C1 and C2, fuse F1, power voltage regulator PVR, resistor R1, and variable resistor R2.

Figure 5:
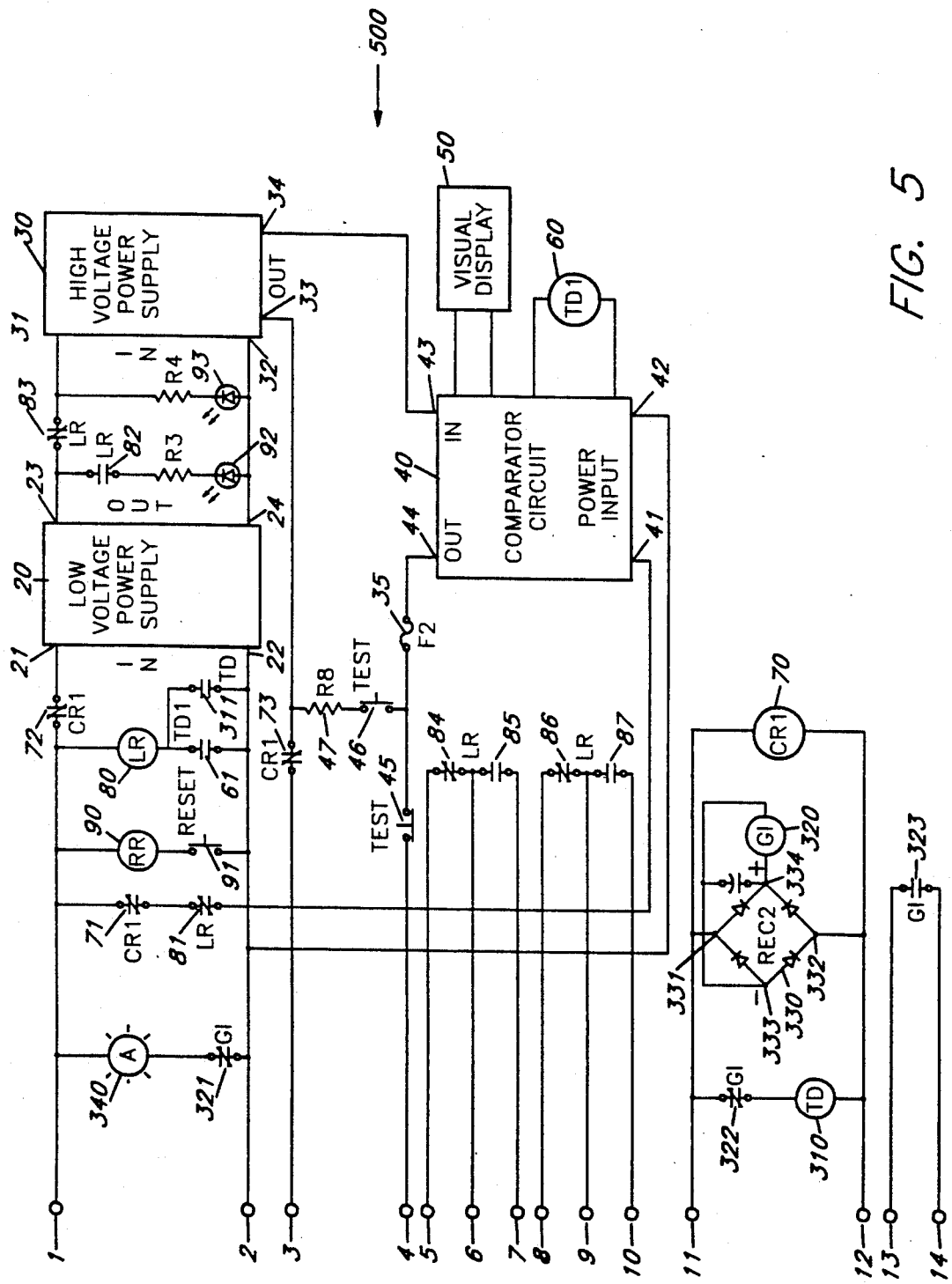
FIG. 5 shows the preferred embodiment of the present invention, which can be used with grounded electrical equipment.
Figure 8:
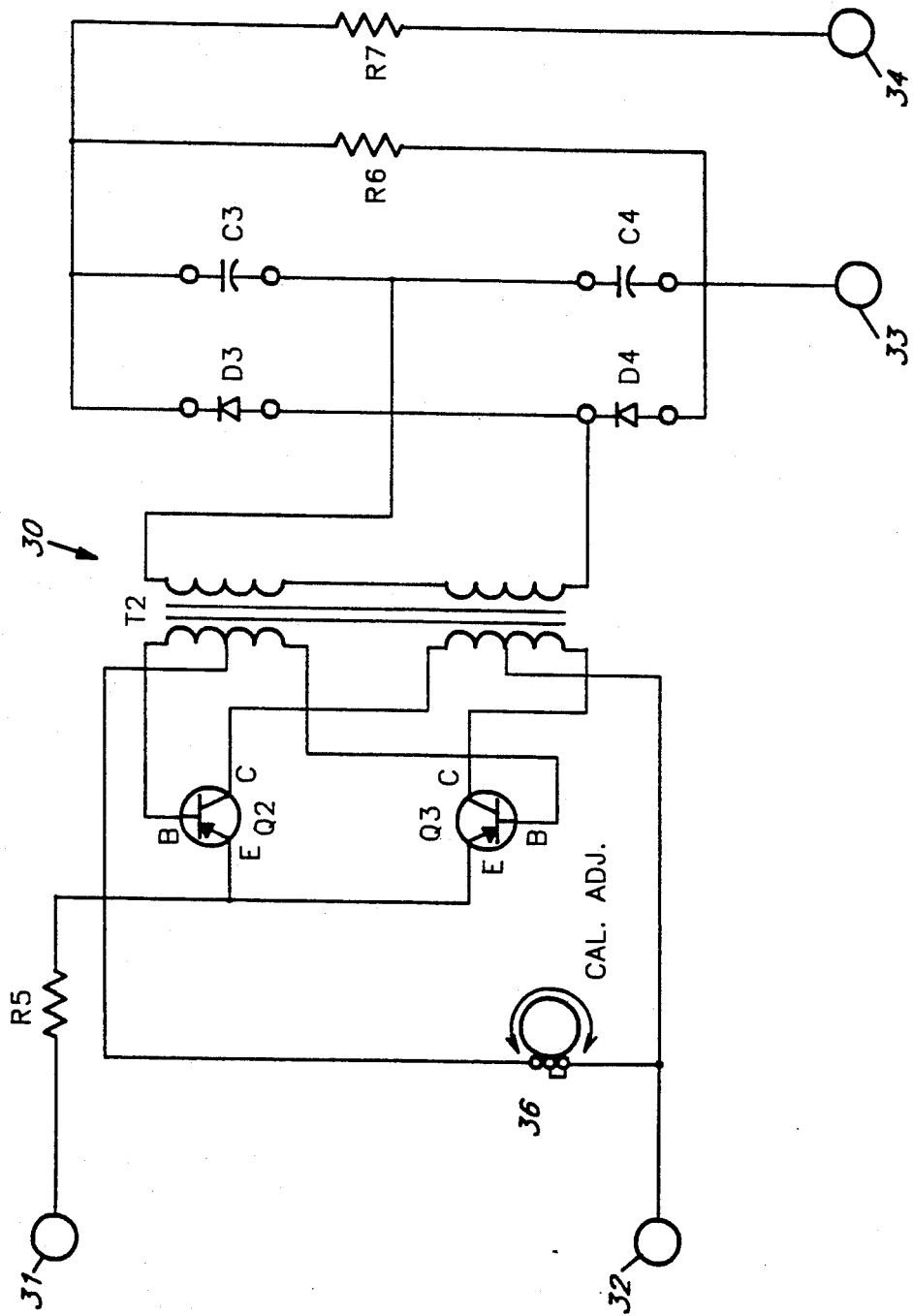
FIG. 8 is a schematic diagram of a high voltage power supply in accordance with the present invention.

FIG. 8 shows a high voltage power supply 30 which can be used in the automatic insulation tester of the present invention. High voltage power supply 30 receives the voltage produced by low voltage power supply 20, and converts it to a high DC voltage which is preferably greater than or equal to the rated voltage of the electrical equipment to be tested. The voltage produced across output terminals 33 and 34 can be, for example, 500 volts. As mentioned earlier in the description of FIGS. 1 and 2, should the operator of the electrical equipment desire to insure that the reading displayed in display 50 is accurate, he presses test switch 48 (FIG. 9) which opens test contact 45 and closes test contact 46, which applies the output of high voltage power supply 30 across test resistor 47 (FIGS. 1, 3 or 5). If high voltage power supply 30 is producing voltage of the proper value, needle 51 (FIG. 9) of display 50 will move to calibration set point 52. If not, calibration adjusting means 36 (FIGS. 8 and 9) is adjusted such that needle 51 moves to calibration set point 52. Also shown in FIG. 8 are resistors R5, R6, and R7, diodes D3 and D4, transistors Q2 and Q3, capacitors C3 and C4, and transformer T2.

Figure 9:
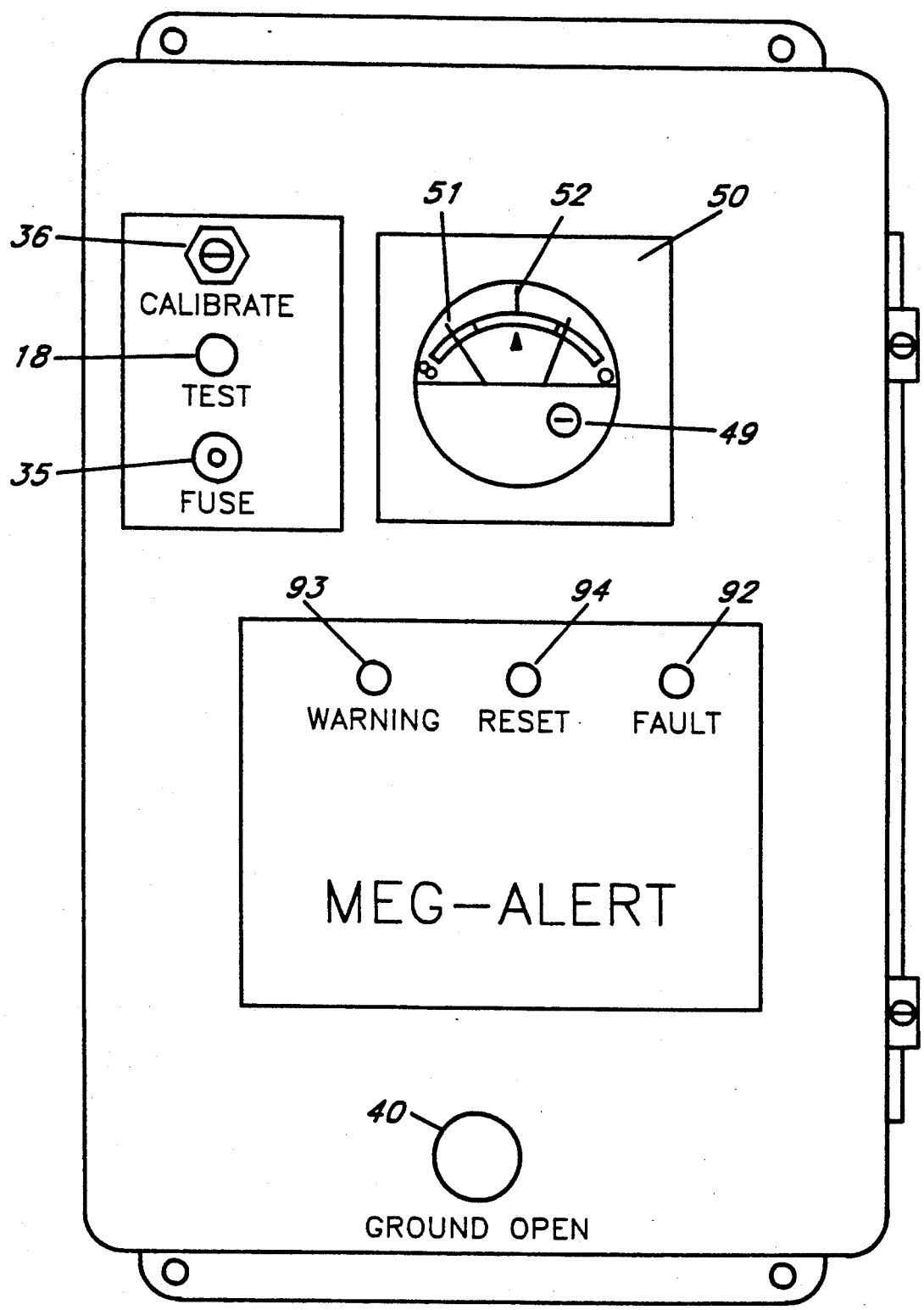
FIG. 9 shows an embodiment of an instrument panel of the automatic insulation tester of the present invention.

Shown in FIG. 9 are resistors R9-R31, capacitors C5-C14, diodes D1 and D2, integrated circuits IC1 and IC2, variable resistors VR1-VR4, transistor TR1, Zener diodes Z1 and Z2, transformer T3, and rectifier bridge REC2. Set point adjusting means 49 (FIG. 9) allows the predetermined value of resistance necessary to trigger a fault condition to be adjusted. Usually, the predetermined value of resistance necessary to trigger a fault condition would be slightly above the value at which damage could occur to the electrical equipment if it were to be operated in that condition. When the automatic insulation tester is used to test insulation resistance of a generator which needs to be always available in the event of a power shortage, for example, a generator for a hospital, the predetermined value of insulation resistance would be set higher, so that if a fault condition were detected by the insulation tester immediately prior to a power outage, the generator could still be used. It should be noted that, when the insulation tester of the present invention is being used to test electrical equipment which needs to always be available, the insulation tester would be hooked up to the equipment such that when the insulation tester detects a fault condition, operation of the equipment would not be impeded. In such a case, one or more of contacts 84-87 could be used to allow the insulation tester to communicate with, for example, a computer in a control room to indicate when the insulation tester detects a fault condition.

Display means 50 can comprise any suitable, preferably highly accurate, ammeter, and displays resistance instead of current. It should be noted that visual display of resistance 50 may also comprise a digital display.

Fuse 35 is preferably placed in series between output terminal 33 of high voltage power supply 30 and test input terminal 44 of comparator circuit 40 such that a test to determine the calibration of the display means 50 will also indicate if fuse 35 is blown, by giving an infinite reading of resistance.

The ground interrupter (that is, the components of the present invention which allow it to be used with grounded electrical systems) may be manufactured separately to allow automatic insulation monitors presently in use to be adapted for use with grounded electrical systems.

Figure 10:
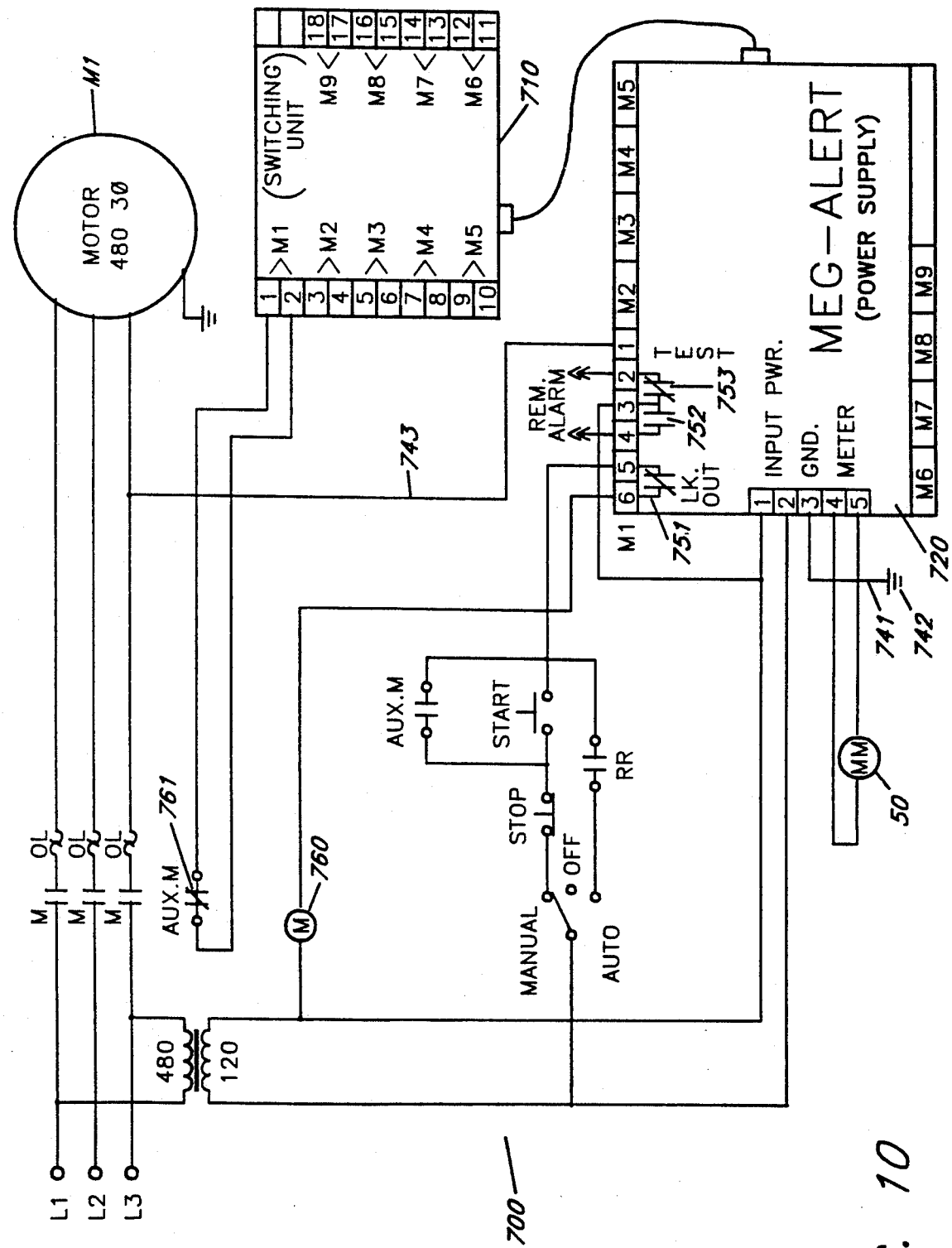
FIG. 10 is a schematic diagram of an embodiment of the present invention which can be used to automatically test several motors.
Figure 11:
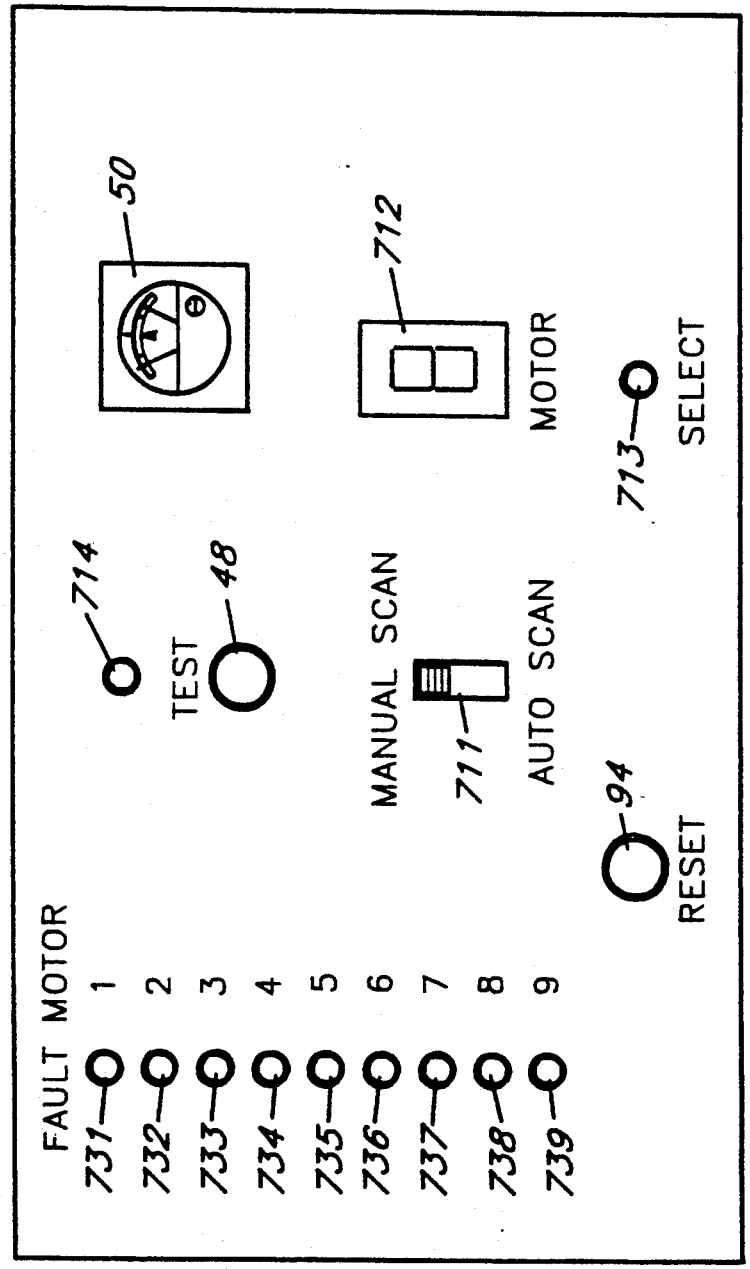
FIG. 11 is a front elevational view of an instrument panel used in conjunction with the embodiment of FIG. 10.

The multiple motor tester unit 700 shown in FIG. 10 is designed to test and monitor up to nine motors with one central insulation tester unit. Unit 700 consists of one power supply and relay module 720, one remote solid state switching control module 710, and a 1% meter indicator 50. The input power can be 12/24 VDC or 120/240 VAC. Unit 700 is equipped with an on/off switch (not shown), test switch 48, and a reset switch 94. The switching control module 710 has an auto-/manual control switch 711, a digital display motor indicator 712 with selector switch 713, a test LED indicator 714, and nine motor fault LED indicators 731-739. The power supply unit 720 requires one wire 741 connected to a common system ground 742 and one wire 743 connected to the B phase winding of each motor to be tested. Preferably the output 33 from the high voltage power supply 30 is also connected to ground, with the output 44 from the comparator circuit 40 being connected to wire 743 of each motor as will be described. There are three sets 751, 752, 753, of contacts, for each motor, that can be used for motor-starter lockout and alarm circuits. The switching control module 710 requires a normally closed contact 761 from each motor starter 760 when motor starter 760 is in the open position and the motor is idle. This indicates to the switching control module 710 whether the motor should be tested or skipped over (if the contact 761 is open, module 710 skips that motor and switches to the next motor which has a closed contact 761).

Once power is supplied to the power supply module 720 and the on/off switch is turned on, the motor indicator 712 will display which motor is being tested. The yellow flashing test LED 714 will light to indicate if that motor is actually being tested or not light if it is being skipped over because it is on-line. By placing the auto/manual switch 711 in the manual position, the operator can choose to test any motor he wants, by pushing the motor select button 713 until the motor indicator 712 shows the motor he desires. The motor will be continuously tested until the operator selects another motor or that motor starts and goes on-line. He can now randomly select motors and test time intervals. In the auto mode the unit 700 will automatically scan through all nine motors at the pre-set time (preferably between thirty seconds and one minute per motor) interval. If at any time either in auto or manual a motor tests below the pre-set minimum insulation level, the corresponding red L.E.D. 731-739 will light and that motor's alarm and lockout contacts 751, 752, 753 will change state. The motor cannot be released from a fault condition until it is selected again and the insulation level tests above the set point. Then the manual reset button 94 can be pressed on the power supply module, returning the motor to operational status. The 1% meter 50 indicator will show the meg-ohm value of each motor insulation when it is selected for testing and the yellow test L.E.D. 714 is flashing. The test button 48 can be used periodically to ensure that unit 700 is operting correctly. By first placing unit 700 in the manual mode and selecting the zero on the digital display, the test button 48 can then be pressed and the meter indicator should go to the calibrate-set position. The alarm set point, test time period, calibrate set point, and set point trip time delay can all be preset during assembly.

Figure 12:
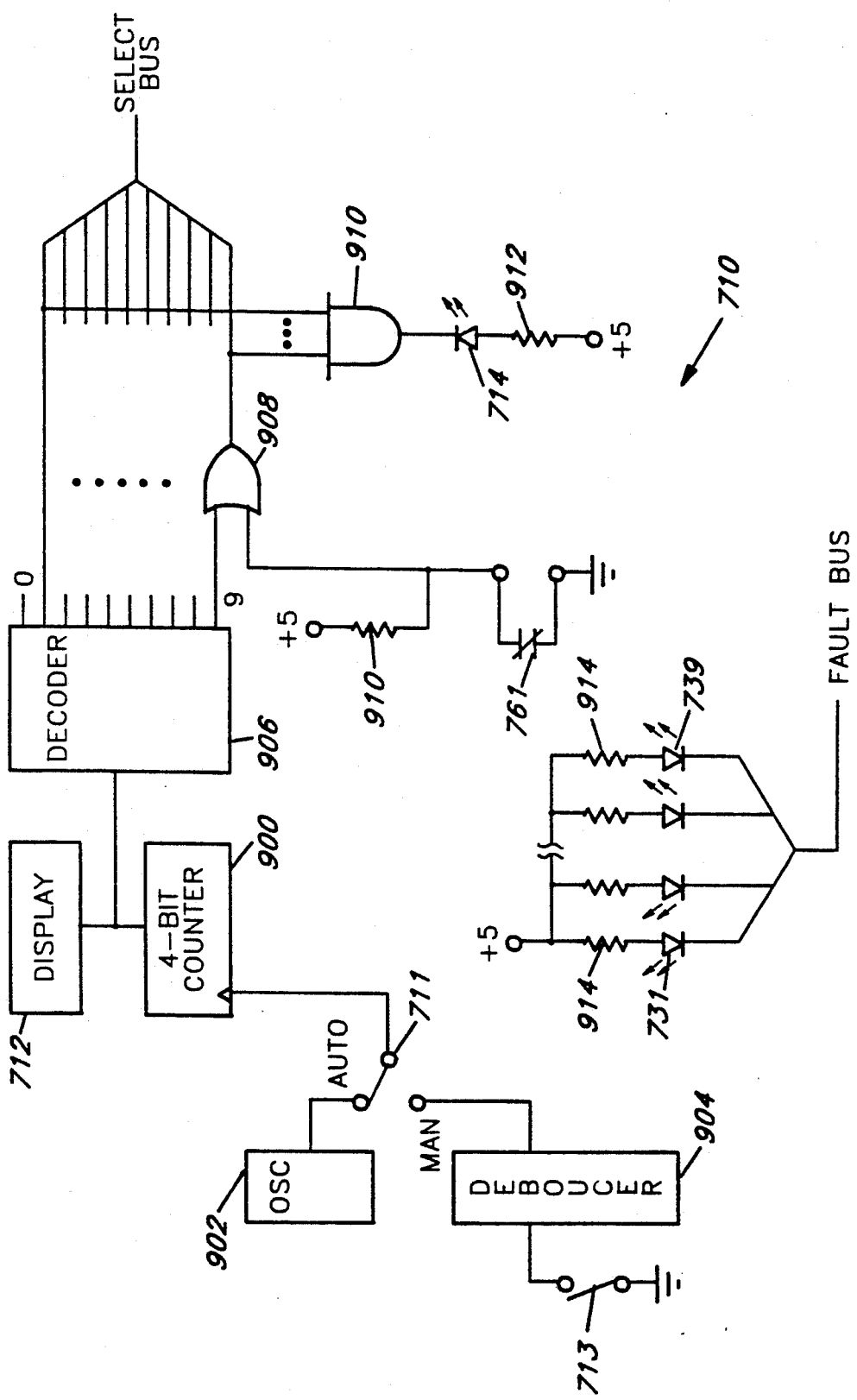
FIG. 12 is a schematic diagram of portions of the switching unit of FIG. 10.

Details of the switching logic of the module 710 are shown in FIG. 12. A four bit counter 900 is used to select which motor is being analyzed or selected. The counter 900 counts from zero to nine and resets to zero, thus providing selection for the nine motors of the preferred embodiment and a non-selected state. The clock input of the counter 900 is connected to the common terminal of the auto/manual switch 711. The auto terminal of the switch 711 is connected to the output of a free running oscillator 902. This oscillator 902 thus provides the automatic selection rate for the system. The manual terminal of the switch 711 is connected to the output of debounce logic 904. The manual selector button 713 is connected to the input of the debounce logic 904. In this manner the operator can advance the counter 900 once for each push of the selector button 713.

The output of the counter 900 is provided to the motor indicator display 712 and to the input of a 4 to 16 decoder 906. The output of the decoder 906 associated with the binary input value goes to a low state when that binary value is present at the input to the decoder 906. Thus the first ten outputs of the decoder 906 cycle low as the counter 900 sequences. The one to nine outputs of the decoder 906 are connected to one input of two input OR gates 908. For simplification only one OR gate 908 is illustrated, the other eight being identical. The second input of the OR gate 908 is connected to one terminal of the normally closed contacts 761 of the motor associated with that OR gate 908, with the other terminal of the contacts 761 being connected to ground. A resistor 910 connected to a high logic level voltage is used to pull this second input to a high level, so that when the motor is activated the output of the OR gate 908 is high, indicating that this motor is not to be analyzed. Thus for the output of the OR gate 908 to be low, both the counter 900 must indicate that particular OR gate 908 and the motor associated with that OR gate 908 must not be running.

The outputs of the OR gates 908 form the SELECT bus, which is provided to the power supply module 720. Additionally, a nine input AND gate 910 receives the outputs of the OR gates 908 as its inputs. The output of the AND gate 910 is connected to the cathode of the LED 714, whose anode is pulled to a positive level through a resistor 912. In this manner, if any of the OR gates 908 has a low output, indicating selection of that motor, the test LED 714 is activated.

The fault LED's 731-739 have their anodes pulled to a high level by resistors 914 and their cathodes connected to the FAULT bus, which is connected to the power supply module 720.

Figure 13:
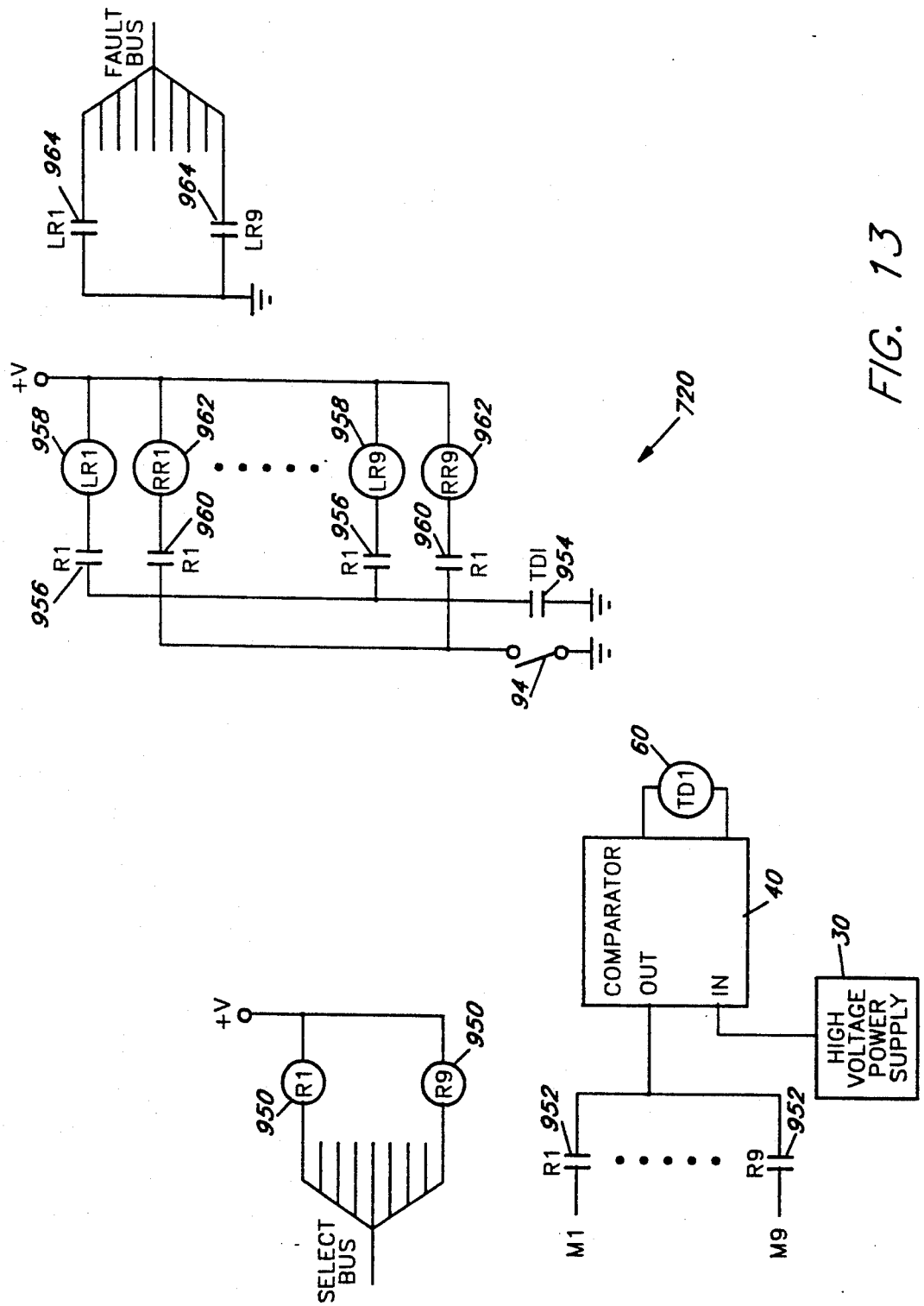
FIG. 13 is a schematic diagram of portions of the power supply of FIG. 10.

Details of the power supply module 720 are shown in FIG. 13. The SELECT bus is connected to a series of relays 950, one for each motor. The relays 950 are connected to a positive supply level. Thus, when the output of the respective OR gate 908 is low, the relay 950 for that motor is activated. Each relay 950 includes three sets of normally open contacts. The first set of contacts 952 are connected to the wire 743 and to the comparator 40. In this manner the wires 743 of the motors are connected to the single comparator 40 used in the preferred embodiment. As the counter 900 counts, the various motors are connected for analysis, but the motor would be bypassed if the motor is activated due to the action of the contacts 761. The comparator 40 enables relay 60 as in the single motor version when a fault is present. The relay 60 includes one normally open contact 954. The contact 954 has one terminal connected to ground and the other to one terminal of the second contact 956 of the relays 950. The second terminal of the contact 956 is connected to the latching relay coil 958 of a latching relay associated with each motor. Thus both a fault must be present and the motor must be selected before that particular motor's latching relay is set.

The reset switch 94 is connected to ground and to one terminal of the third set of contacts 960 of the relays 950. The second terminal of the contacts 960 is connected to the release relay coils 962 of the latching relays. Thus the motor must be selected before the fault indication can be cleared.

In addition to the latching relay contacts 751 provided to disable the motor and 752 and 753 provided for alarm purposes, another normally open latching relay contact 964 is used with the fault LED's 731–739. One terminal of the contact 964 is connected to ground and the other terminal to the FAULT bus. Thus, when the relay is latched, the respective LED 731–739 is connected to ground and energized.

Thus, by this multiplexing and demultiplexing only a single comparator circuit 40 is needed to monitor several motors.

Aside from the features described herein which enable it to be used to automatically test several motors, unit 700 can be identical in all other respects to any of the motor testers (e.g., insulation tester 400) described herein, even though not all of the details of those embodiments are shown in FIGS. 10 to 13.

Figure 14:
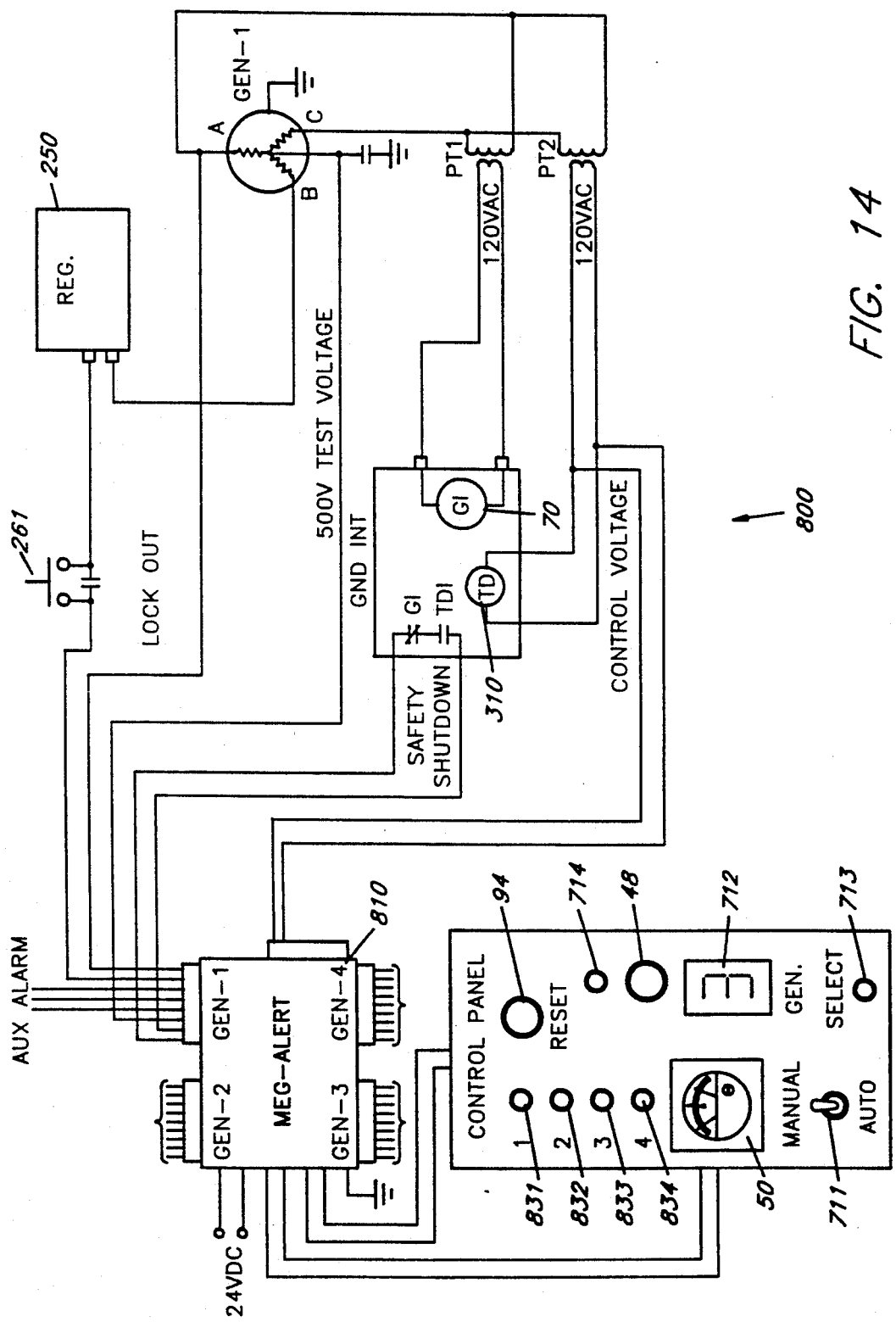
FIG. 14 is a schematic diagram of an embodiment of the present invention which can be used to automatically test several generators.

FIG. 14 shows multiple generator unit 800 that is designed specifically for four generators and operates in a manner similar to that of the multiple motor unit 700. It has circuitry to interface with ground interrupters. Unit 800 includes a switching control module 810, fault indicating red LEDs 831–834, and other features shown in FIG. 14. In the generator version, selection is done in a similar fashion as in the motor case, but both outputs from the high voltage supply are provided to the generator.

Aside from the features described herein which enable it to be used to automatically test several generators, unit 800 can be identical in all other respects to any of the generator testers (e.g., insulation tester 300) described herein, even though not all of the details of those embodiments are shown in FIG. 14.

A remote acquisition controller (RAC) can also be provided. The purpose of the remote acquisition controller (not shown) is to serve as an interface between the automatic testers disclosed herein and any terminal/computer, allowing the user to access control of the switching module (710, 810) from a remote terminal and to select motors for testing and receive data back at the terminal.

This function involves an analog-to-digital conversion process and RS232 hand shaking.

Information hierarchy is as follows:
1) Meg readings are timed for true and accurate measurements.
2) Analog to digital conversion is processed.
3) Data streaming to a central processing unit is formatted and transmitted.
   (a) Hexadecimal carriage control is sent
   (b) Then the motor number is transmitted-
   (c) Followed by a three digit unit number in hexadecimal-
   (d) Finally a two digit hexadecimal number representing the meg reading.

Data is then captured by the receiving CPU for analysis (or just displayed via a terminal).

Remote selection of any motor can be done via a computer or any ASCII terminal for continuous testing. This unit can be manually disabled for safety at the switching control module.

Because many varying and different embodiments may be made within the scope of the invention concept herein taught, and because many modifications may be made in the embodiments herein detailed in accordance with the descriptive requirement of the law, it is to be understood that the details herein are to be interpreted as illustrative and not in a limiting sense.

I claim:

1. A ground interrupter for electrical equipment having a chassis, a winding and normally having an electrical connection between the winding and the chassis when the equipment is operative, said ground interrupter comprising:
   ground interrupting means for automatically interrupting the electrical connection between said winding and said chassis when the electrical equipment is inoperative; and
   means for connecting the ground interrupting means to the electrical equipment;
   wherein said ground interrupting means comprises:
   a contact in said electrical connection; and
   relay means to cause said contact to be open when said electrical equipment is inoperative and to be closed when said electrical equipment is operative;
   wherein said relay means comprises:
   a relay coil which energizes when said electrical equipment is operative, causing said contact to close, and
   the ground interrupter further comprising:
   means to interrupt operation of said electrical equipment should said relay means fail to cause said contact to be closed when said electrical equipment is operative.

2. The ground interrupter of claim 1, wherein said means to interrupt operation of said electrical equipment comprises:
   a time delay relay coil which energizes should said relay means fail to cause said contact to be closed when said electrical equipment is operative, wherein energization of said time delay relay coil opens a second contact connected to the electrical equipment and opening of said second contact interrupts operation of said electrical equipment.

* * * * *